United States Patent [19]
Satoh

[11] Patent Number: 6,090,720
[45] Date of Patent: Jul. 18, 2000

[54] WET ETCHING METHOD FOR SILICON SEMICONDUCTOR WAFER

[75] Inventor: Tsutomu Satoh, Niigata-ken, Japan

[73] Assignee: Naoetsu Electronics Company, Niigata-Ken, Japan

[21] Appl. No.: 09/019,553

[22] Filed: Feb. 6, 1998

[30] Foreign Application Priority Data

Dec. 26, 1997 [JP] Japan ...................................... 9-360545

[51] Int. Cl.[7] .............................. H01L 21/302; C23F 1/02
[52] U.S. Cl. ........................... 438/745; 747/748; 156/345
[58] Field of Search ..................................... 438/745, 747, 438/748; 156/345

[56] References Cited

U.S. PATENT DOCUMENTS

| | | | |
|---|---|---|---|
| 5,014,229 | 5/1991 | Brock et al. | 252/79.1 |
| 5,904,572 | 5/1999 | Lee et al. | 438/745 |
| 5,914,281 | 6/1999 | Abe et al. | 438/747 |

FOREIGN PATENT DOCUMENTS

| | | | |
|---|---|---|---|
| 762482 | 3/1997 | European Pat. Off. | H01L 21/00 |
| 54-98181 | 8/1979 | Japan | H01L 21/302 |
| 5-166793 | 7/1993 | Japan | H01L 21/306 |
| 6-84881 | 3/1994 | Japan | H01L 21/306 |
| 7-297168 | 11/1995 | Japan | H01L 21/306 |
| 9-69510 | 3/1997 | Japan | H01L 21/306 |

OTHER PUBLICATIONS

Patent Abstract of Japan, vol. 018, No. 336 (E–1568), Jun. 24, 1994.
Patent Abstract of Japan, vol. 017, No. 568 (E–1447), Oct. 14, 1993.
English language abstract of JP 7–297168. Nov. 10, 1995.
English language abstract of JP 6–84881. Mar. 25, 1994.
English language abstrat of JP 54–98181. Aug. 2, 1979.
English language abstract of JP 9–69510. Mar. 11, 1997.

*Primary Examiner*—Benjamin L. Utech
*Assistant Examiner*—Lynette T. Umez-Eronini
*Attorney, Agent, or Firm*—Greenblum & Bernstein, P.L.C.

[57] ABSTRACT

Wet etching method and apparatus in which a wafer is processed so as to have a good flatness by making uniform a travel distance and a traveling velocity of an arbitrary point on a wafer surface relative to an etching solution, while rotating the wafer in the etching solution. An etching solution vessel comprises a pair of walls parallel to a plane of rotation of a wafer; and walls of curved surfaces, which intersect the pairs of walls at a right angle, and whose centers of curvature are the same, and which are spaced apart from each other along a radius of curvature with a distance of d therebetween; the etching solution is fed from a lower part of the vessel; and a flow velocity of the etching solution is adjusted at an arbitrary point between the pair of curved surfaces just before a stream of the solution contacts with a wafer rotating in the etching solution so that the flow velocity is a velocity ($r\omega$), which is obtained by multiplying a distance r between the center of curvature and the arbitrary point with an angular velocity $\omega$ of the wafer or an approximation thereof.

4 Claims, 4 Drawing Sheets

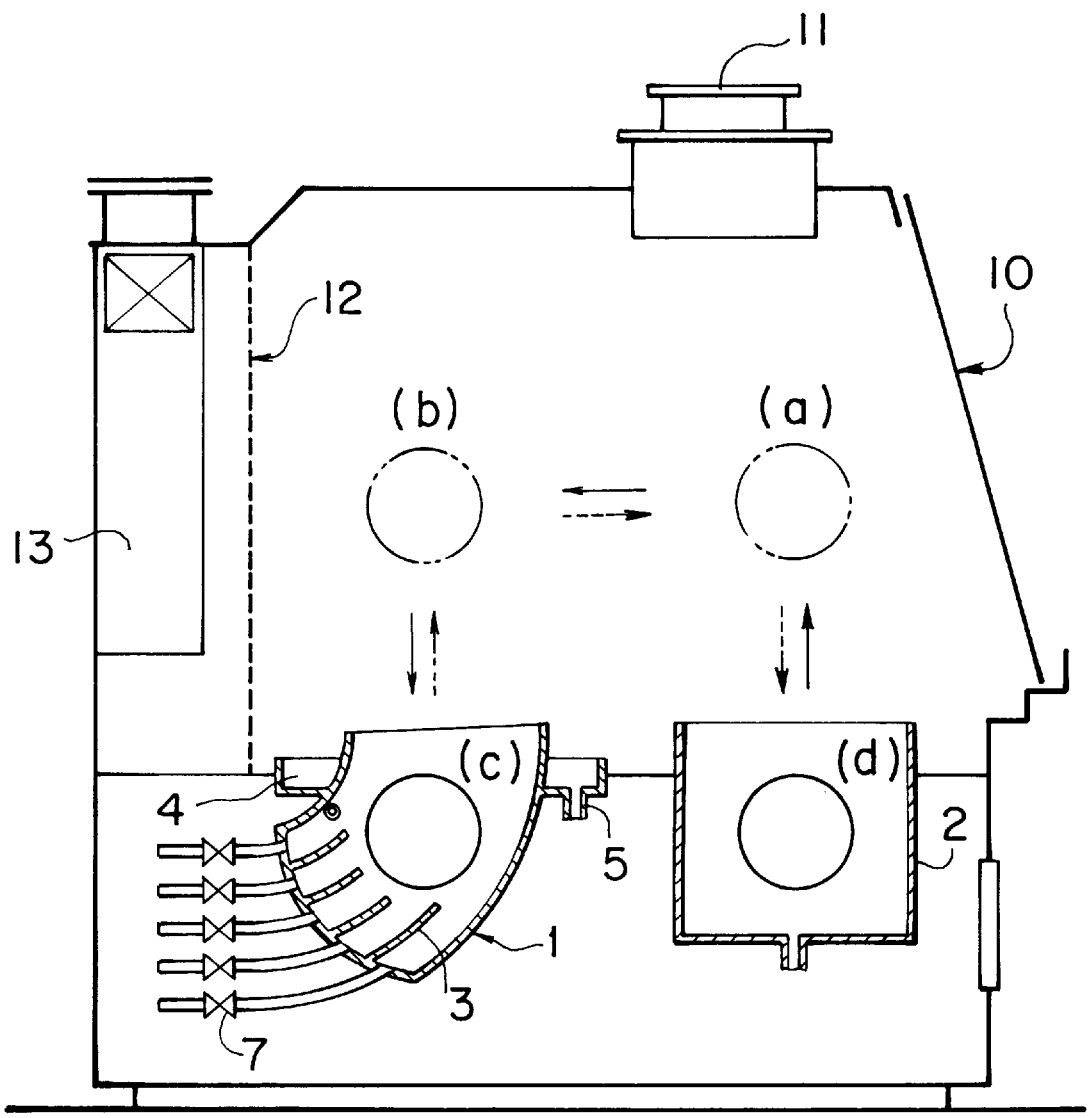

WET ETCHING METHOD FOR SILICON SEMICONDUCTOR WAFER

BACKGROUND OF THE INVENTION

1. Technical Field of the Invention

The present invention relates to an etching method in which a wafer is directly immersed in an etching solution comprising a mixture of acids for a predetermined time to remove part of the wafer by etching and more particularly, to a wet etching method in order to secure a good flatness of a silicon semiconductor wafer even of a large diameter.

2. Conventional Art

A conventional etching method has been conducted in the following fundamental manner: As shown in FIG. 1A, an etching solution is fed to a vessel 1 from an inlet port 6 formed at a lower portion of the vessel 1 and guided in a space of the vessel through a rectifying plate 2 to form a constant flow velocity (shown by arrows) and plural wafers 3 are held in the etching solution in such a manner that each plural wafer 3 is held with a main surface at a vertical position while being supported by one driving shaft 4 and three support shafts 5 and the plural wafers are etched regularly at a constant pitch along the axial direction, while rotating at a velocity of rotation of tens of rpm. The wafers 3 are immersed into the etching solution in the vessel at one action from over the solution, while rotating in the same condition mentioned above, and thereafter subjected to etching in the solution in the above mentioned manner for a predetermined time in which a target removal by etching is achieved. Thereafter, the wafers are taken out and immediately thereafter, the wafers are again immersed into water to rinse off the etching solution attached to them. Thus the etching treatment process is completed.

The etching solution generally is composed of a mixture of acids (nitric acid, hydrofluoric acid and acetic acid) and water as diluent and it is recovered from a recovery port 8 through an overflow receiver 7 and cooled for recycling.

If an etching solution was an absolutely stationary liquid, a relative velocity of a wafer to the etching solution would be so simple and clear that there are the maximum value at the periphery of the wafer and nothing at the center thereof.

The difference in velocity between the periphery and center automatically results in a difference in cooling effect, and temperature is more rapidly raised as a position on the wafer surface is nearer the center due to reaction heat, so that a removal rate by etching is larger in the central portion. A sectional profile of the wafer after the etching is obtained having a smallest thickness in the central portion.

What's worse, the etching process is hard to be continued due to increase in the temperature of the etching solution, when the process is operated batchwise. Therefore, as is mentioned above in the description of the prior art, in a practical case, the etching solution is fed in the etching process while temperature thereof is controlled at a constant value by some means in order to keep temperature of the etching solution from rising in excess by a reaction heat during etching. However, a feed of the etching solution is generally set at about a fraction of a peripheral velocity of the wafer in terms of a linear velocity in section of the vessel thereof.

FIG. 1B is a diagram showing changes in velocity of three points on a wafer, which are a point at the periphery, a point of a half radius from the center and a point at the center, relative to the etching solution in one rotation of the wafer in a condition that a ratio of a peripheral velocity to a flow velocity of the etching solution is 4 to 1, wherein A, B and C indicate points at the periphery, a half radius from the center and the center respectively, and the ordinate represents the rate of relative velocity and the abscissa represents the angular position of each measuring points.

The velocity at the center is a constant small value, which is indicated by a dotted line. The velocity at each of the periphery and a half radius from the center is both largely changed. The abscissa represents an angular position and at the same time represents an elapsed time. An area contained between a curve and the abscissa shows a distance of travel of each point relative to the etching solution around one rotation of the wafer.

To sum up;
the relative velocity:
periphery>r/2 point>center
the travel distance:
periphery>r/2 point>center.

This clearly shows a difference in cooling effects on the wafer between the three points during etching and a cooling effect is decreased at a point closer to the central portion, whereby a thickness is also decreased at a point closer to the central portion since reaction temperature and reaction velocity are increased in combination as cooling effect is decreased. Thus a flatness of the wafer is deteriorated.

However, in order that an influence of rotation of a wafer during etching on flatness thereof is minimized or reduces so as to be neglected, a flow velocity of the etching solution supplied from a lower part of the vessel is required to extremely larger than a relative velocity of the wafer to the etching solution or theoretically large infinitely, which is actually impossible.

SUMMARY OF THE INVENTION

The present invention has been made in light of the above mentioned problem of a conventional technique and has an object to provide a wet etching method in which a wafer is processed so as to have a good flatness by making uniform a travel distance and a traveling velocity of a point on a wafer surface relative to an etching solution, while rotating the wafer in the etching solution.

In order to solve the problem, the present invention provides the following:

A feeding method for an etching solution and a structure of a vessel containing the etching solution, in which plural silicon semiconductor wafers are etched by rotating at a predetermined rotational velocity in an immersed manner in the vessel, whose top is open, having a cross-sectional shape of a rectangle and containing the etching solution comprising a predetermined mixture of acids for a predetermined time, while the etching solution is supplied, characterized in:

that the vessel comprises: a pair of walls parallel to a plane of rotation of a wafer; and walls of curved surface, which intersect the pairs of walls at a right angle, and whose centers of curvature are the same, and which are spaced apart from each other along a direction of a radius of curvature with a distance of d therebetween;

that the etching solution is fed from a lower part of the vessel; and that a flow velocity of the etching solution is adjusted at an arbitrary point between the walls of curved surfaces just before a stream of the solution contacts with a wafer rotating in the etching solution so that the flow velocity is a velocity (rω), which is obtained by multiplying a distance r between the center of curvature and the arbitrary point with an angular velocity ω of the wafer or an approximation thereof.

The present invention also provides a flow velocity of the etching solution is adjusted at an arbitrary point between the pair of curved surfaces just before a stream of the solution contacts with a wafer rotating in the etching solution so that the flow velocity is a velocity (rω), which is obtained by multiplying a distance r between the center of curvature and the arbitrary point with an angular velocity ω or an approximation thereof, characterized in:

that a space between the walls of curved surfaces in the tank is partitioned by plural curved plates having predetermined curvatures in such a manner that an upper portion of the space of the vessel, which the plural wafers occupy, is kept from the plural partitioning plates so as to allow free rotation of the plural wafers only leaving a narrow margin between the edges of the plural plates and the plural wafers;

that plural partitioned spaces by the plates work as plural solution guides; and that different flow velocities are respectively adjusted for the solution guides.

The present invention also provides forming plural solution guides in the vessel by the partitioning plates provided in a lower portion than the wafers inserted in the vessel and flow velocities are respectively different in the plural solution guides, and further comprising that the solution in the plural solution guides is controlled to have different temperatures.

Moreover, a pipe having a fine hole can be provided in a lower region along a curved surface of a wall nearer the center of curvatures and for obtaining a jet of a gas of a predetermined flow rate is jet.

Therefore, according to the present invention, an ideal etching condition can be established and thereby even a wafer having a large diameter can be treated by etching with a very good flatness or a very good process accuracy.

When a wafer is rotated at a angular velocity (ω) in the same direction as a direction of a stream of the etching solution, which has a velocity (rω) proportional to a radius r of curvature, wherein a velocity of a stream changes along the direction of a radius of curvature, but streamlines are kept in a concentric relation with each other, a relative velocity of the wafer to the etching solution at an arbitrary point on the wafer has the same magnitude and direction, which will be described using FIG. 2 in a supplemental manner.

In the figure, since an arbitrary point R on the wafer is located at distances of $r_2$ from the center of the wafer and $r_1$ from the center of curvature and the point R of the wafer has a relative velocity RB ($r_2\omega$) perpendicular to $O_wR$ and a flow velocity RD ($r_1\omega$) is perpendicular to OR contrary to a flowing direction of the etching solution, the composed velocity is indicated as RC.

It is set that an angle $ROO_w$ is indicated by $\theta_1$ an angle $RO_wO$ is indicated by $\theta_2$ and $OO_w$ is indicated $R_o$ of a constant and the following relations are obtained: which are:

In $\Delta$RBC, $$RC^2=(r_1\omega)^2+(r_2\omega)^2-2r_1r_2\omega^2\{-\cos(\theta_1+\theta_2)\} \quad (1)$$

In $\Delta O_wRO$, $$OO_w^2=(r_1)^2+(r_2)^2-2r_1r_2\{-\cos(\theta_1+\theta_2)\} \quad (2)$$

From the equations (1) and (2), the following relation is derived, that is:

$$RC=R_o\omega \text{(constant)}$$

When an intersection between a line RD and a line $OO_w$ is indicated by $E_0$ and an intersection between a line RC and a line $OO_w$ is indicated by E, since $\Delta ORO_w$ and $\Delta RDC$ are similar to each other and thereby an angle CRD is $\theta_1$ and $\Delta ORE_o$ is a right triangle, an angle REO=90°.

That is, a relative velocity of a wafer to the etching solution is constant at an arbitrary point on the wafer and the direction of a velocity is vertical.

To conduct etching in a stream of the etching solution having a relative velocity adjusted in such a manner is to secure that a travel velocity relative to the etching solution at an arbitrary point on the wafer and a travel distance thereof per a unit time are always constant and thereby a cooling effect at any point is the same, which makes the wafer etched in an ideal condition and can realize a wafer etching treatment with a good flatness and uniform removal by etching.

As a method to adjust a flow rate of the etching solution, since it is an established way to provide a resistance, which does not disturb streamlines of a flow of the etching solution, just before the wafer in etching, it is an easy way that, for example, a punching plates or the like, which is shaped so as to have an opening, which is larger according to a distance from the center of curvature, are disposed in order to adjust a velocity of a stream.

The partitioning plates can be disposed to points just before a space which the wafers to be etched occupy while rotating in an etching operation, avoiding intrusion of the plates to the space and the space is partitioned between the walls of curved surfaces by the partitioning plates. Moreover, different flow rates are directly adjusted for each of the plural solution guides and target velocities for the respective solution guides (which are obtained each by multiplying a distance from the center of curvature with an angular velocity). Such a method is direct and certain and can cope with different diameters of wafers with ease.

The fundamental issue that heat dissipation in the central portion of the wafer is weak is more conspicuous in a wafer of a larger diameter and the temperature difference caused by the weakness of heat dissipation in the central portion of the wafer can be solved by cooling more the central portion of the wafer through adjustment of a temperature of the etching solution supplied to each solution guide differently, whereby an etching treatment with a better flatness can be achieved.

Beside, a jet gas can push the etching solution upwardly and thus stream conditions along a curved surface on the inner side wall can be controlled and corrected so as to achieve the object of the present invention, by providing a pipe having a fine hole in the vicinity of the vessel along a curved surface of the wall nearer the center of curvatures, said pipe being able to jet atomized gas. A viscosity of the etching solution may be in a common range. Since a stream along the curved surface of the inner side wall is not necessarily produced in conformity with the curvature and "peeling", "a stagnant flow" and "a locally reverse current" arise independently or in combination, a stream in the vicinity can be provided in an orderly manner without any difference from the target stream by using a gas jet. An actual stream close to the target stream can approximately be obtained by setting a jet flow rate according to actual stream conditions.

An etching method makes it possible, that a velocity and a travel distance of a wafer relative to an etching are more uniform, while the wafer is rotated, which is a fundamental condition, and thereby realizes a etching treatment with a good flatness of a wafer.

Besides, it is made possible that an adjustment in the feed flow rate of the etching solution can be effected with ease and certainty.

Moreover, it is made possible that the central portion of a wafer can be cooled more, compared with the peripheral portion, so that dissipation from a wafer is more uniform.

Furthermore, it is made possible that a stream of the etching solution along the curved surface of the inner side wall can be corrected so as to be a target velocity.

BRIEF DESCRIPTION OF DRAWING

FIG. 3 is a schematic view showing an entire etching apparatus for executing an etching method of the present invention.

PREFERABLE EMBODIMENT OF THE INVENTION

Examples of the present invention will be described below.

EXAMPLE 1

Etching of a wafer of 150 mm in diameter was conducted in the following fundamental conditions, which are:

etching solution: standard mixed acid (nitric acid, hydrofluoric acid, acetic acid and water for dilution)

feed temperature: 37° C. recycling mode rotational number of wafer: 20 rpm ($\omega$=2.1 rad/sec)

Figure 1A:
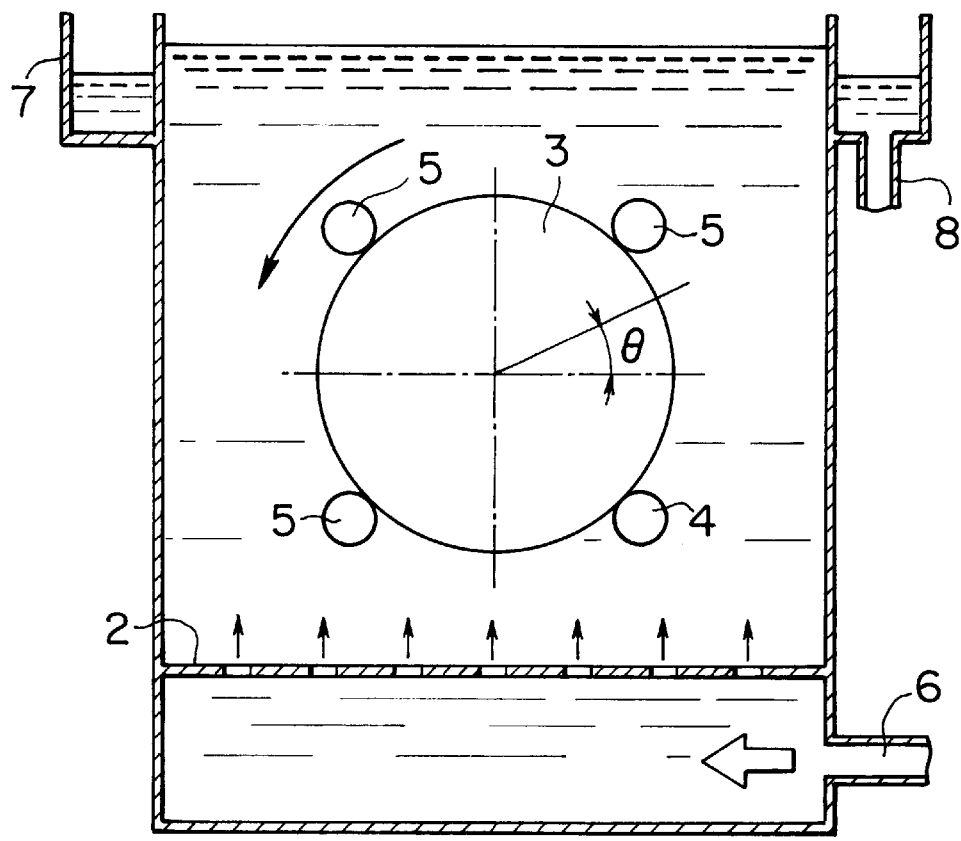
FIG. 1A is a schematic view showing a structure of an etching solution vessel used for executing a conventional etching method and FIG. 1B is a diagram showing a relative velocity of three arbitrary points on a rotating wafer to the etching solution in the conventional etching method.
Figure 1B:
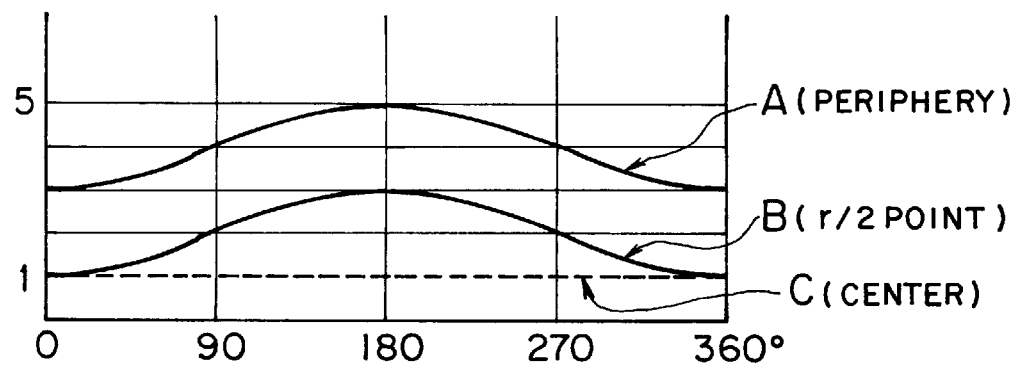
Figure 2:
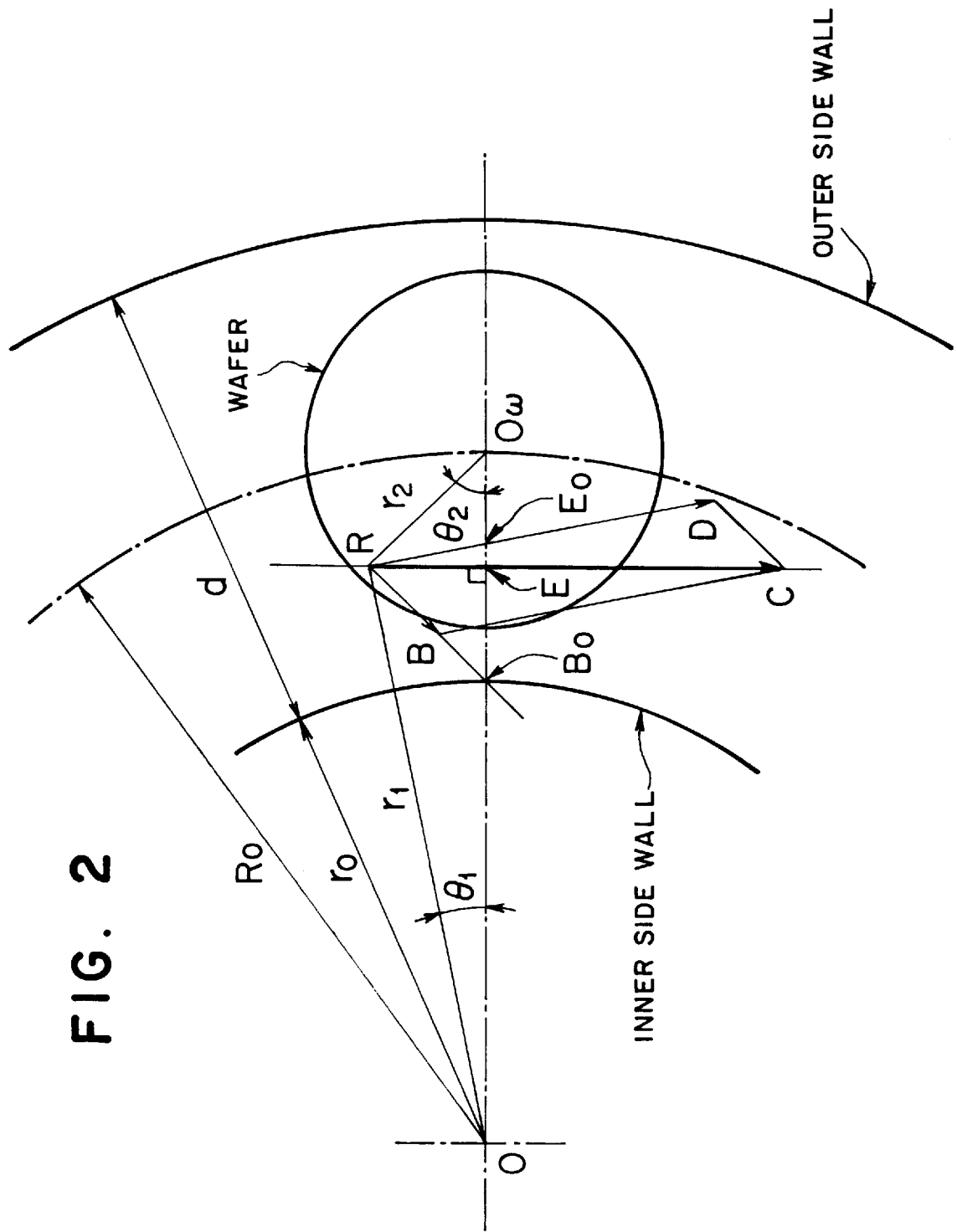
FIG. 2 is a supplemental view for an illustration.

FIG. 3 shows a view showing the entire etching apparatus for executing an etching method of the present invention and, as shown in the conventional apparatus of FIG. 1, plural wafers held by a driving shaft and plural support shafts in a freely rotatable manner are moved horizontally from a position (a) to a position (b) above an etching vessel and then immersed in one action to a position (c) in the etching vessel, wherein the wafers are stated to be rotated at the position (b) and kept to be rotated, and then after a predetermined time is elapsed the wafers are taken out from the vessel and again immersed in a cleaning vessel 2 to be at a position (d) in one action through positions (b) and (a) in a reverse way.

When the etching solution on the wafers is removed by cleaning water, they are taken out, and thus the etching treatment is completed.

The etching solution can be predetermined flow velocities for the respective solution guides (five parts) partitioned by the four partitioning plates 3 each having a curved surface located in a lower portion of the solution vessel 1, wherein each solution guide has a valve 7 or a flow rate variable pump connected thereto. The etching solution overflowed from the solution vessel 1 is collected from a recovery port 5 connected to an overflow receiver 4 to a solution collecting tank (not shown) and collected etching solution is recycled for use after cooling to a predetermined temperature of 37° C. FIG. 3 shows the entire apparatus commonly called as etching draft, in which 10 indicates an open/close door in the working, 11 indicates an intake port for fresh air equipped with a filter, 12 indicates a suction hole for sucking a poisonous gas produced in an etching operation and 13 indicates a raschig ring packed column for pretreatment of the poisonous gas.

Figure 4A:
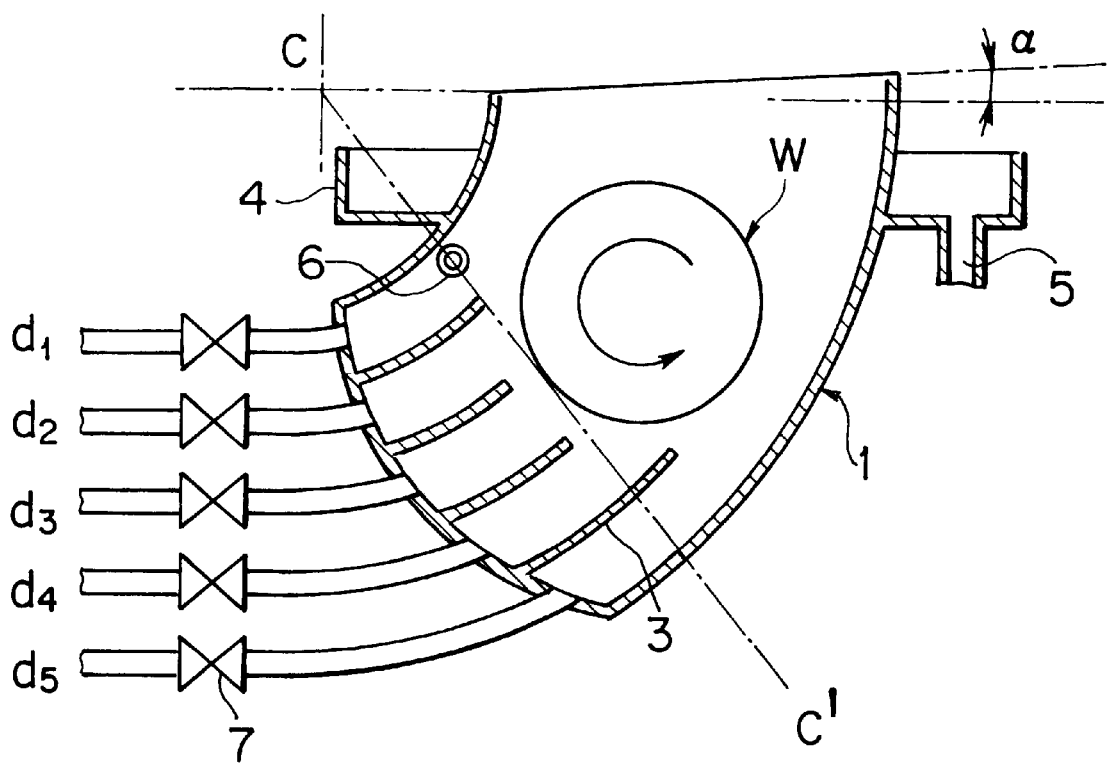
FIG. 4A is an enlarged view of an etching solution vessel.

FIG. 4A is a enlarged view of the etching solution vessel shown in FIG. 3. Reference numerals used in the figure are used an integrated manner with those in FIG. 3 and W indicates a position of the wafers during etching. The partitioning plates 3 are extended with different lengths at positions just before the wafers while the space, in which the wafers are positioned, is avoided from any intrusion of the partitioned plates. Moreover, a jet pipe 6 for a gas is located so as to be directed to a direction perpendicular to the sheet surface of paper, while many holes on the upper side are formed on the jet pipe 6. The jet pipe 6 improves conditions of streams along the curved surface of the inner side wall wherein the streams would otherwise be apt to be stagnant.

It is another improvement for achievement of the target of the present invention that a predetermined angle $\alpha$ is provided at the upper end edge of the vessel, which contributes to correction of a flow condition.

Figure 4B:
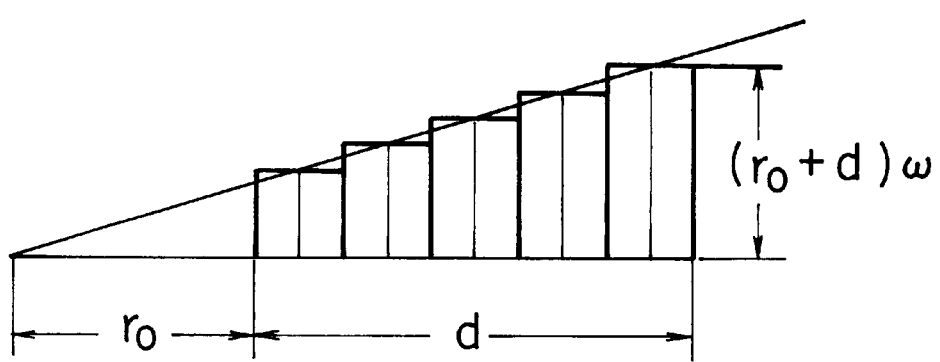
FIG. 4B is a graph showing a velocity distribution profile.

FIG. 4B is a graph showing the flow velocity of the etching solution at a position (line CC' in the figure) just before the etching solution contacts with a wafer and a flow velocity of a stream is adjusted so as to have a velocity of $r\omega$, which is proportional to a distance from the center C of curvature for a solution guide separated by the partitioning plates through which the stream flows. In the graph, velocities naturally changes stepwise between each other in distribution, but actually since a velocity on the inner side is decreased, while a velocity on the outer side is increased, a theoretical stepwise broken line is modified to an actual sloped line having a constant gradient in a graph showing a velocity distribution.

In the example, as an angular velocity of a wafer in rotation, $\omega$=2.1 rad/sec. As the other conditions, $r_o$=125 mm and d=200 mm, and d is partitioned to provide five solution guides with four partitioning plates while the ends thereof are located at positions just before the wafers in etching, wherein distances between adjacent partitioning plates are indicated respectively from the inner side nearer the center of curvature $d_1$, $d_2$, $d_3$, $d_4$, $d_5$, and average flow velocities are adjusted to be in the same order respectively 0.30, 0.39, 0.47, 0.56, 0.64 m/sec.

In the velocity distribution adjusted in such a manner, a velocity can maintain a constant in a constant direction (downward) at an arbitrary point on the wafer, which magnitude is $\{(r_0+d/2)\omega=0.47 \text{ m/sec}\}$ and an ideal condition for an etching treatment with a extremely good flatness can thus be effected.

EXAMPLE 2

Etching of a wafer of 300 mm in diameter was conducted in the following fundamental conditions, which are:

etching solution: standard mixed acid (nitric acid, hydrofluoric acid, acetic acid and water for dilution)

feed temperature: 27° C. recycling mode rotational number of wafer: 15 rpm ($\omega$=1.57 rad/sec)

The entire apparatus in which the example is executed is similar to that shown in FIG. 3 of example 1.

In example 2, a diameter of a wafer to be etched is 300 mm, the number of wafers is 13 and rotational number of wafer is 15 rpm, (an angular velocity in rotation $\omega$=1.57 rad/sec) is employed and conditions of $\omega_0$=125 mm and d=400 mm are also adopted.

As in example 1, the d is partitioned to provide five solution guides with four partitioning plates, wherein distances between adjacent partitioning plates, as in the example 1 are indicated respectively from the inner side nearer the center of curvature $d_1$, $d_2$, $d_3$, $d_4$, $d_5$, and average flow velocities are adjusted to be in the same order respectively 0.26, 0.34, 0.51, 0.63, 0.76 m/sec.

In the example, a velocity can maintain a constant in a constant direction (downward) at an arbitrary point on the wafer, which magnitude is $\{(r_0+d/2)\omega=0.51 \text{ m/sec}\}$ and an ideal condition for an etching treatment with a extremely good flatness can be effected.

In addition, in the case of the example 2, a diameter of a wafer is larger than that of the example 1, since heat dissipation in the central portion is weaker, as described above, and thereby a progressive velocity of a reaction of the etching solution is increased therein. In order to prevent such a trend, a flow rate into the solution guide of a part $d_3$ is required to be a flow rate, which is met with above flow rate and at the same time the solution flowing into the solution guide has a temperature 25° C., which is lower by 2° C., compared with a temperature of the solution supplied for the other solution guides of 27° C. in order to solve the above mentioned problem of weak heat dissipation. Such conditions can be realized with ease if the etching solution is collected from the recovery port through the overflow receiver and all the etching solution is cooled to 27° C. and part of the etching solution for recycling is further cooled.

In the example 2, as well, in order to improve a stream on the inner side wall of a curved surface, which is apt to be stagnant in the extremity, a jet pipe 6 for gas may be used as previously described.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope and spirit of the invention as defined by the appended claims.

What is claimed is:

1. A wet etching method for silicon semiconductor wafers, comprising:

a feeding method for an etching solution and a structure of an open top vessel including a rectangular cross-section containing the etching solution, the etching solution comprising a mixture of acids in which plural silicon semiconductor wafers are etched by rotating at a rotational velocity in an immersed manner in the vessel for a period of time while the etching solution is supplied, and the vessel comprising:

a pair of walls parallel to a plane of rotation of the wafers; and walls of curved surfaces, which intersect the pairs of walls at a right angle, and whose centers of curvature are the same, and which are spaced apart from each other along a direction of a radius of curvature with a distance of d therebetween; and the etching solution is fed from a lower part of the vessel; and adjusting flow velocity of the etching solution at an arbitrary point between the walls of curved surfaces just before a stream of the solution contacts with a wafer rotating in the etching solution so that the flow velocity is a velocity ($r\omega$), which is obtained by multiplying a distance r between the center of curvature and the arbitrary point with an angular velocity $\omega$ of the wafer or substantially the angular velocity $\omega$;

a space between the walls of curved surfaces in the vessel is partitioned by plural curved plates forming a plurality of partitioned spaces, said plural curved plates having curvatures in such a manner that an upper portion of the space of the vessel, which the plural wafers occupy, is kept from the plural partitioning plates so as to allow free rotation of the plural wafers only leaving a narrow margin between the edges of the plural plates and the plural wafers; and the plurality of partitioned spaces form plural solution guides, and the adjusting flow velocity of etching solution includes obtaining different flow velocities in the plural solution guides.

2. The wet etching process according to claim 1, wherein said etching solution in the plural solution guides has different temperatures.

3. The wet etching process according to claim 1, further comprising flowing a jet of gas through a pipe having a fine hole positioned in a lower region than wafers immersed inside the vessel along a curved surface of a wall nearer the center of curvatures.

4. The wet etching process according to claim 1, further comprising flowing a jet of gas through a pipe having a fine hole positioned in a lower region than wafers immersed inside the vessel along a curved surface of a wall nearer the center of curvatures.

* * * * *

UNITED STATES PATENT AND TRADEMARK OFFICE
CERTIFICATE OF CORRECTION

| | | |
|---|---|---|
| PATENT NO. | : 6,090,720 | Page 1 of 1 |
| DATED | : July 18, 2000 | |
| INVENTOR(S) | : T. Satoh | |

It is certified that error appears in the above-identified patent and that said Letters Patent is hereby corrected as shown below:

<u>Column 8,</u>
Line 42, "claim 1" should be -- claim 2 --.

Signed and Sealed this

Twenty-fifth Day of December, 2001

Attest:

JAMES E. ROGAN
*Attesting Officer*     *Director of the United States Patent and Trademark Office*